United States Patent
Mugler, III et al.

(10) Patent No.: US 7,034,533 B2
(45) Date of Patent: Apr. 25, 2006

(54) METHOD AND SYSTEM FOR RAPID MAGNETIC RESONANCE IMAGING OF GASES WITH REDUCED DIFFUSION-INDUCED SIGNAL LOSS

(75) Inventors: John P. Mugler, III, Charlottesville, VA (US); James R. Brookeman, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 10/514,272

(22) PCT Filed: May 14, 2003

(86) PCT No.: PCT/US03/15136

§ 371 (c)(1),
(2), (4) Date: Nov. 12, 2004

(87) PCT Pub. No.: WO03/098390

PCT Pub. Date: Nov. 27, 2003

(65) Prior Publication Data

US 2005/0174114 A1   Aug. 11, 2005

Related U.S. Application Data

(60) Provisional application No. 60/380,760, filed on May 15, 2002.

(51) Int. Cl.
*G01V 3/00* (2006.01)
(52) U.S. Cl. ...................... 324/318; 324/309
(58) Field of Classification Search ............... 324/318, 324/319, 322, 309, 307, 300; 600/410
See application file for complete search history.

(56) References Cited

U.S. PATENT DOCUMENTS 5,485,086 A   1/1996   Meyer et al.

(Continued)

OTHER PUBLICATIONS

Albert, M.S., Cates, G.D., Driehuys, B., Happer, W., Saam, B., Springer, Jr., C.S. and Wishnia, A., 1994, "Biological Magnetic Resonance Imaging Using Laser-polarized 129Xe," Nature, vol. 370, pp. 199-201.

(Continued)

*Primary Examiner*—Brij B. Shrovastav
(74) *Attorney, Agent, or Firm*—Robert J. Decker (57) ABSTRACT

A methodology, system and computer program product for designing and optimizing a rapid magnetic resonance imaging pulse sequence for creating images of a gas or gas-filled structure with substantially reduced diffusion-induced signal attenuation during the course of data acquisition compared to that for currently available magnetic resonance imaging techniques is disclosed. The methodology and system allows desirable combinations of image signal-to-noise ration, spatial resolution and temporal resolution to be achieved that were heretofore not possible. For example, magnetic resonance imaging of hyperpolarized noble gases, which recently has shown significant promise for several medical imaging applications, particularly imaging of the human lung, can be improved. Pulse sequences designed according to the subject methods permit signal levels to be achieved that are up to ten times higher than those possible with the gradient-echo methods now commonly used for hyperpolarized-gas imaging. This signal increase can be traded for substantially lower does, and hence much lower cost, of the hyperpolarized-gas agent. The methodology and system will also be useful for non-biological applications of hyperpolarized gases for example material science studies, as well as for magnetic resonance imaging of any other gas for biological or non-biological applications. Pulse sequences designed according to the subject methods can also serve as the foundation for a variety of specialized gas-imaging pulse sequences, such as those for apparent-diffusion-coefficient, dynamic or oxygen-concentration imaging.

15 Claims, 5 Drawing Sheets

U.S. PATENT DOCUMENTS

| | | | |
|---|---|---|---|
| 5,545,396 | A | 8/1996 | Albert et al. |
| 5,565,776 | A | 10/1996 | Kanazawa |
| 5,617,859 | A * | 4/1997 | Souza et al. ............ 600/420 |
| 5,749,834 | A | 5/1998 | Hushek |
| 5,785,953 | A | 7/1998 | Albert et al. |
| 5,789,921 | A | 8/1998 | Albert et al. |
| 6,230,039 | B1 | 5/2001 | Stuber et al. |
| 6,281,681 | B1 | 8/2001 | Cline et al. |
| 6,618,609 | B1 * | 9/2003 | Liu et al. ............ 600/419 |
| 6,630,126 | B1 | 10/2003 | Driehuys et al. |
| 6,775,568 | B1 | 8/2004 | Mugler, III et al. |
| 2004/0260173 | A1 | 12/2004 | Salerno et al. |

OTHER PUBLICATIONS

De Lange, E.E., Mugler, III, J.P., Brookeman, J.R., Knight-Scott, J., Truwit, J.D., Teates, C.D., Daniel, T.M., Bogorad, P.L. and Cates, G.D., 1999, "Lung Air Spaces: MR Imaging Evaluation with Hyperpolarized 3He Gas," Radiology, vol. 210, pp. 851-857.

Donnelly, L.F., MacFall, J.R., McAdams, H.P., Majure, J.M., Smith, J., Frush, D.P., Bogonad, P., Charles, H.C. and Ravin, C.E., 1999, "Cystic Fibrosis: Combined Hyperpolarized 3He-enchanced and Conventional Proton MR Imaging in the Lung—Preliminary Observations," Radiology, vol. 212, pp. 885-889.

Durand, E., Guillot, G., Darasse, L., Tastevin, G., Nacher, P.J. Vignaud, A., Vattolo, D. and Bittoun, J., 2002, "CPMG Measurements and Ultrafast Imaging in Human Lungs with Hyperpolarized Helium-3 at Low Field (0.1 T)," Magnetic Resonance in Medicine, vol. 47, pp. 75-81.

Salerno, M., de Lange, E.E., Altes, T., Truwit, J.D., Brookeman, J.R. and Mugler, III, J.P., 2002, "Emphysema: Hyperpolarized Helium 3 Diffusion MR Imaging of the Lungs Compared with Spirometric Indexes—Initial Experience," Radiology, vol. 222(1), pp. 252-260.

Salerno, M., Altes, T.A., Brookeman, J.R., de Lange, E.E. and Mugler, III, J.P., 2001, "Dynamic Spiral MRI of Pulmonary Gas Flow Using Hyperpolarized 3He: Preliminary Studies in Healthy and Diseased Lungs," Magnetic Resonance in Medicine, vol. 46, pp. 667-677.

* cited by examiner

METHOD AND SYSTEM FOR RAPID MAGNETIC RESONANCE IMAGING OF GASES WITH REDUCED DIFFUSION-INDUCED SIGNAL LOSS

CROSS-REFERENCE TO RELATED APPLICATIONS

This application is a national stage filing of International Application No. PCT/US03/15136, filed on May 14, 2003, which claims benefit under 35 U.S.C Section 119(e) from U.S. Provisional Application Ser. No. 60/380,760, filed May 15, 2002, entitled "Method and Apparatus for Rapid Magnetic Resonance Imaging of Gases with Reduced Diffusion-Induced Signal Loss," the entire disclosures of which are hereby incorporated by reference herein in their entirety.

FIELD OF THE INVENTION

The present invention relates to magnetic resonance imaging (MRI), and more particularly for using hyperpolarized gases together with rapid MRI pulse sequences designed to yield reduced diffusion-induced signal loss.

BACKGROUND OF THE INVENTION

Nuclear magnetic resonance imaging (MRI) is an important modality for both clinical and basic-science imaging applications. A recent notable advance in MRI was the introduction of the "hyperpolarized" noble gases helium-3 ($^3$He) and xenon-129 ($^{129}$Xe) as novel magnetic-resonance contrast agents [1]. Nuclear polarization levels approaching 100 percent can be achieved using hyperpolarized noble gases, and this dramatic increase in the polarization compared to that typically achieved at thermal equilibrium (at most approximately $10^{-4}$) has presented the opportunity for many new MRI applications. For example, high-resolution MR images of the lung air spaces have been demonstrated following the inhalation of hyperpolarized-$^3$He gas [2–5], and studies suggest that $^3$He lung imaging shows promise for differentiating healthy lungs from those with pathologies such as chronic obstructive pulmonary disease [6,7], asthma [8] and cystic fibrosis [9].

Achieving a high signal-to-noise ratio (SNR) through optimization of the MRI acquisition method (that is, the "pulse sequence") has long been a fundamental goal in the development of MRI because the thermal-equilibrium nuclear magnetic resonance signal is inherently weak. Although hyperpolarized gases intrinsically provide a large nuclear polarization, the SNR performance of the associated pulse sequences is still of prime concern because hyperpolarized gases are expensive to prepare and, in the case of $^3$He, are in limited world supply. Therefore, MRI pulse sequences for hyperpolarized-gas imaging that provide high SNR of are significant practical importance. Furthermore, since the hyperpolarized magnetization is inherently in a non-equilibrium state, the lifetime of the hyperpolarized state (as measured by the T1 relaxation time) is limited, for many practical applications to 10–100 seconds, and thus applicable MRI pulse sequences should also acquire the image data rapidly.

In the case of sufficiently long T2 relaxation times, it is well established in conventional proton ($^1$H) MRI that pulse sequences which maintain the phase coherence of at least a significant fraction of the transverse magnetization during the application of successive radio-frequency (RF) pulses are useful for rapid, high-SNk magnetic resonance imaging. Examples of such techniques commonly used for $^1$H MRI include RARE imaging [10] and its derivatives such as HASTE [11], and FISP imaging [12]. However, the application of these established techniques for rapid, high-SNR hyperpolarized-gas imaging is limited due to diffusion-induced signal attenuation that results from the diffusion of the gas in the magnetic-field gradients required for imaging and those progresses during data acquisition. (The diffusivities of the free gases are approximately $10^4$–$10^5$ larger than that for water protons in the body of an animal or human.) The degree of signal attenuation increases with decreasing voxel size (that is, increasing spatial resolution) and thus the spatial resolution is limited by the associated image blurring that result from the progressive signal attenuation during data acquisition.

A recently published study that investigated the use of RARE-type pulse sequences for hyperpolarized $^3$He MRI of the human lung claimed, based on theoretical analysis and corresponding experimental results, that the diffusion-dependent resolution limit for RARE-type techniques is 6 mm [13]. In contrast, transverse-magnetization-spoiled, gradient-echo-based MRI pulse sequences currently used for hyperpolarized-gas imaging of the human lung typically use an in-plane resolution of approximately 3 mm, and higher spatial resolution may certainly be needed for other or future applications of hyperpolarized gases. Nonetheless, for hyperpolarized-gas imaging, these spoiled, gradient-echo-based MRI pulse sequences yield (for equal spatial resolution) only approximately one-tenth of the signal that could be provided by a RARE-type pulse sequence if the diffusion-induced signal attenuation during the RARE-type pulse sequence could be made to be negligible.

Therefore, it would clearly be of significant practical importance if it were possible to appropriately optimize pulse sequences that maintain the phase coherence of at least a significant fraction of the transverse magnetization during the application of successive RF pulses to minimize diffusion-induced signal attenuation and therefore permit the SNR advantage of these techniques to be realized for hyperpolarized-gas imaging in conjunction with higher spatial resolution. This SNR increase can be traded for substantially lower dose, and hence much lower cost, of the hyperpolarized-gas contrast agent. In addition to in-vivo hyperpolarized gas imaging, such optimized techniques would potentially also be useful for non-biological applications of hyperpolarized gases, for example material science studies, as well as for magnetic resonance imaging of any other gas for biological or non-biological applications. These optimized techniques could also serve as the foundation for a variety of specialized gas-imaging pulse sequences, such as those for apparent-diffusion-coefficient [14] or dynamic [15] imaging.

BRIEF SUMMARY OF THE INVENTION

The present invention comprises the methodology, computer program product, and system for designing and optimizing a rapid MRI pulse sequence for creating images of a gas or gas-filled structure with substantially reduced diffusion-induced signal attenuation during the course of data acquisition compared to currently available MRI techniques. The present invention thereby allows desirable combinations of image signal-to-noise ratio, spatial resolution and temporal resolution to be achieved that were heretofore not possible. These "diffusion-optimized" gas-imaging pulse sequences are based on the following design goals, applied as appropriate for the application at hand: (i) spatial-encoding magnetic-field gradient waveforms are designed to have a zeroth moment approximately equal to zero; (ii) as appropriate, spatial and/or spatial-spectral selection magnetic-field gradient waveforms are designed to have a zeroth moment approximately equal to zero; (iii) as appropriate, flip angles for the refocusing RF pulses are set approximately equal to 180°; (iv) as appropriate, the k-space trajectory is specifically optimized to provide a low level of diffusion-induced signal attenuation throughout the acquisition for either a single-shot or multi-shot acquisition; (v) spatial-encoding magnetic-field gradient waveforms are designed to exclude as much as possible any periods within the waveform during which the gradient amplitude is zero; (vi) as appropriate, magnetic-field gradient waveforms are optimized to approximately minimize diffusion-induced signal attenuation based on the gradient-hardware specifications; (vii) as appropriate, the data sampling period and the associated spatial-encoding gradient waveforms are considered jointly for approximately maximizing the SNR while maintaining a predetermined level of image blurring, and/or a predetermined level of one or more other image artifacts such as a susceptibility-induced artifact; and (viii) as appropriate, the order of phase-encoding is arranged to increase the overall signal level during the acquisition compared to that for a conventional sequential phase-encoding order. These design goals may be performed in various orders and/or with modified procedures, systems, or structures suitable to a given application.

An application of the present invention is magnetic resonance imaging of hyperpolarized noble gases, which recently has shown significant promise for several medical imaging applications, particularly imaging of the lung. Pulse sequences designed according to the methods of the present invention permit signal levels to be achieved that are up to ten times higher than those possible with the gradient-echo methods now commonly used for hyperpolarized-gas imaging.

The present invention will also be useful for inter alia non-biological applications of hyperpolarized gases, for example material science studies, as well as for magnetic resonance imaging of any other gas for biological or non-biological applications. Pulse sequences designed according to the methods of this invention can also serve as the foundation for a variety of specialized gas-imaging pulse sequences, such as those for apparent-diffusion-coefficient, dynamic or oxygen-concentration imaging.

In a first aspect, the present invention feat=res a method for generating a pulse sequence for operating a magnetic resonance imaging system for imaging a region of an object, wherein at least a portion of the region contains gas, including but not limited to hyperpolarized noble gas, for at least a portion of the time required to apply said pulse sequence, said method comprising the steps of:

(a) selecting spatial-encoding magnetic-field gradient waveforms to be approximately fully rephased, that is to have a zeroth moment approximately equal to zero (which includes fully rephased, that is to have a zeroth moment precisely equal to zero), over the time period between pairs of successive said RF pulses in said pulse sequence;

(b) if desired, selecting spatial and/or spatial-spectral selection magnetic-field gradient waveforms associated with said RF pulses in said pulse sequence to be approximately fully rephased;

(c) if it is not desired to have approximately fully-rephased spatial or spatial-spectral selection magnetic-field gradient waveforms of step 'b', and/or it is desired to have spoiling magnetic-field gradients associated with refocusing RF pulses, setting the flip angles for said refocusing RF pulses approximately equal to 180°;

(d) if a specific type of k-space trajectory is not required, optimizing said k-space trajectory to provide a low level of diffusion-induced signal attenuation throughout the acquisition for either a single-shot or multi-shot acquisition; and (e) selecting said spatial-encoding magnetic-field gradient waveforms to exclude as much as possible any time in said spatial-encoding magnetic-field gradient waveforms during which the gradient amplitude is zero.

In a second aspect, the present invention features a magnetic resonance imaging system for generating a pulse sequence for operating said magnetic resonance imaging system for imaging a region of an object, wherein at least a portion of the region contains gas, including but not limited to hyperpolarized noble gas, for at least a portion of the time required to apply said pulse sequence, the system comprising:

a main magnet system for generating a steady magnetic field in at least a region of the object to be imaged;

a gradient magnet system for generating temporary magnetic field gradients in at least a region of the object to be imaged;

a radio-frequency transmitter system for generating radio-frequency pulses in at least a region of the object to be imaged;

a radio-frequency receiver system for receiving magnetic resonance signals from at least a region of the object to be imaged;

a reconstruction system for reconstructing an image of the object from the received magnetic resonance signals; and a control system for generating signals controlling the gradient magnet system, the radio-frequency transmitter system, the radio-frequency receiver system, and the reconstruction system, wherein the control system generates signals causing:

(a) spatial-encoding magnetic-field gradient waveforms to be applied that are selected to be approximately fully rephased, that is to have a zeroth moment approximately equal to zero (which includes fully rephased, that is to have a zeroth moment precisely equal to zero), over the time period between pairs of successive RF pulses in said pulse sequence;

(b) if desired, spatial and/or spatial-spectral selection magnetic-field gradient waveforms associated with RF pulses in said pulse sequence to be applied that are selected to be approximately fully rephased;

(c) if it is not desired to have approximately fully-rephased spatial or spatial-spectral selection magnetic-field gradient waveforms of step 'b', and/or it is desired to have spoiling magnetic-field gradients associated with refocusing RF pulses, flip angles for said refocusing RF pulses to be applied that are set to be approximately equal to 180°;

(d) if a specific type of k-space trajectory is not required, a k-space trajectory to be applied that is optimized to provide a low level of diffusion-induced signal attenuation throughout the acquisition for either a single-shot or multi-shot acquisition; and (e) said spatial-encoding magnetic-field gradient waveforms to be applied that are selected to exclude as much as possible any time in said spatial-encoding magnetic-field gradient waveforms during which the gradient amplitude is zero.

In a third aspect, the present invention features a computer readable media carrying encoded program instructions for causing a programmable magnetic resonance imaging system to perform the method discussed above in the first aspect of the invention. Similarly, the invention features a computer program product comprising a computer useable medium having computer program logic for enabling at least one processor in a magnetic resonance imaging system to generate a pulse sequence, the computer program logic comprising the method discussed above in the first aspect of the invention.

BRIEF DESCRIPTION OF THE DRAWINGS

The foregoing and other objects, features and advantages of the present invention, as well as the invention itself, will be more fully understood from the following description of preferred embodiments, when read together with the accompanying drawings in which.

DETAILED DESCRIPTION OF THE INVENTION

In the following, first presented is an exemplary embodiment of a MR system for practicing the MR methods of the present invention for imaging an object, moving or stationary. Second, the methods of the present invention are described. Finally, examples of the pulse sequence design are described.

An Exemplary MR-System of the Present Invention

Figure 8:
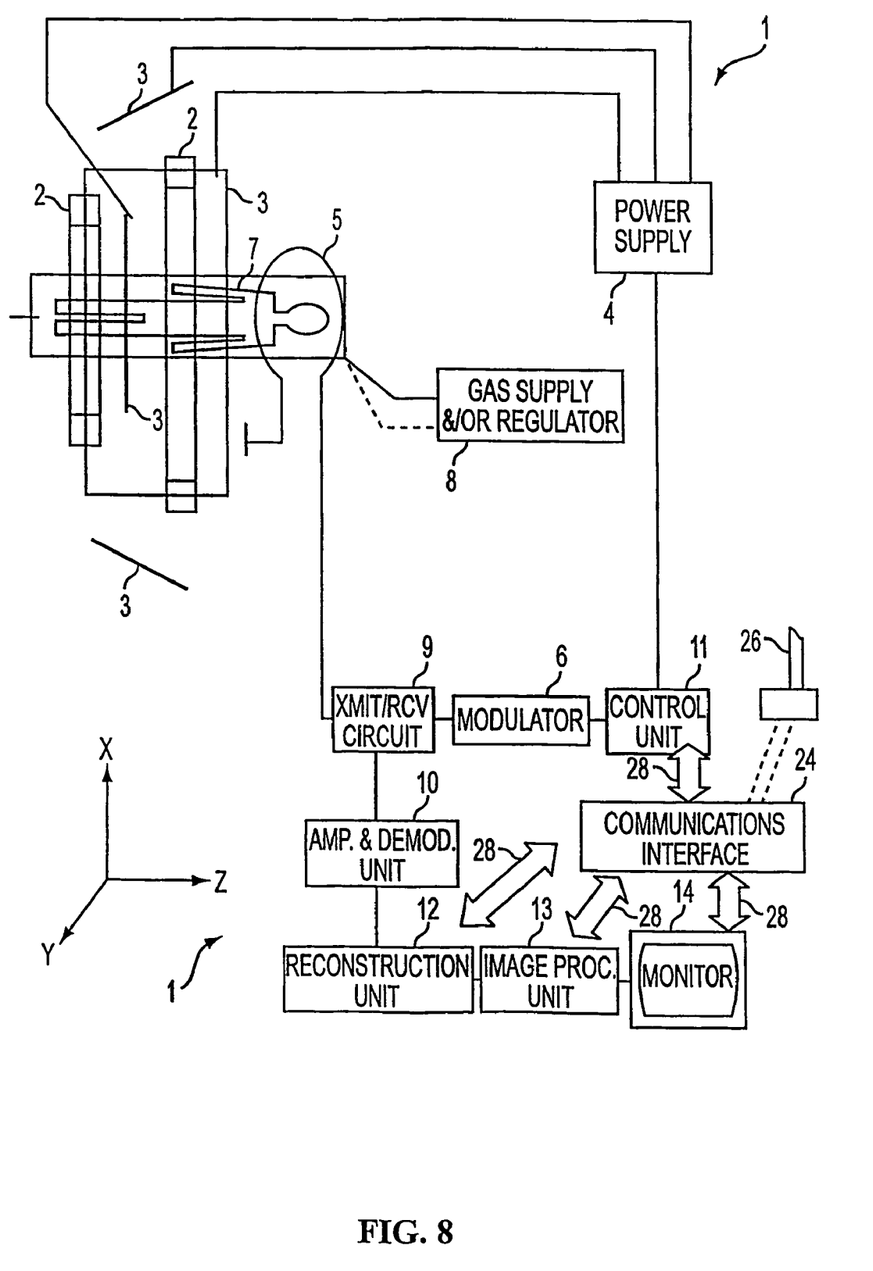
FIG. 8 illustrates a simplified exemplary embodiment of a MRI system for practicing the present invention. The present invention method can be applied to various commercially available MRI systems.

FIG. 8 illustrates a simplified schematic of a MR system 1 for practicing the present invention. The MR system 1 includes a main magnet system 2 for generating a steady magnetic field in an examination zone(s) of the MR system. The z-direction of the coordinate system illustrated corresponds to the direction of the steady magnetic field generated by the magnet system 2.

The MR system also includes a gradient magnet system 3 for generating temporary magnetic fields $G_x$, $G_y$, and $G_z$ directed in the z-direction but having gradients in the x, y or z directions, respectively. With this magnetic gradient system, magnetic-field gradients can also be generated that do not have directions coinciding with the main directions of the above coordinate system, but that can be inclined thereto, as is known in the art. Accordingly, the present invention is not limited to directions fixed with respect to the MR system. In this application, for ease of description, the directions x, y and z (and the gradients along these directions) are used for the readout direction, the phase-encode direction and slice-selection direction (or second phase-encode direction for 3D imaging), respectively.

Also, while traditional commercial methods provide linear gradients in the x, y, or z directions it is also possible not to utilize all three of these linear gradients. For example, rather than using a linear z gradient, one skilled in the art can use a z-squared dependence or some other spatial dependence to provide desired results.

The magnet systems 2 and 3 enclose an examination zone(s) which is large enough to accommodate a part of an object 7 to be examined, for example a part of a human patient. A power supply means 4 feed the gradient magnet system 3.

The MR system also includes an RF transmitter system including RF transmitter coil 5, which generates RF pulses in the examination zone and is connected via transmitter/receiver circuit 9 to a RF source and modulator 6.

The RF transmitter coil 5 is arranged around the part of body 7 in the examination zone. The MR system also comprises an RF receiver system including an RF receiver coil that is connected via transmitter/receiver circuit 9 to signal amplification and demodulation unit or system 10. The receiver coil and the RF transmitter coil 5 may be one and the same coil.

A gas supply (and/or gas regulator) 8 provides hyperpolarized noble gas to the examination zone or region of the object/subject (body, cavity, or the like). The gas supply may be an attachable supply line to the object/subject or may be a portable gas supply such as a container, bolus delivery device, or dose bag. As would be appreciated by one skilled in the art, there are wide variety of methods and systems adapted for supplying hyperpolarized gas to the object or subject (or region and examination zone). For illustrative examples of magnetic resonance imaging using hyperpolarized gases the following patent applications are hereby incorporated by reference herein in their entirety: 1) pending and co-assigned U.S. patent application Ser. No. 09/804,369 filed on Mar. 12, 2001, entitled "Diagnostic Procedures Using Direct Injection of Gaseous Hyperpolarized 129Xe and Associated Systems and Products," and its corresponding International Patent Application Ser. No. PCT/US01/07812 filed Mar. 12, 2001 (Publication No.: WO/01/67955 A2), 2) pending and co-assigned U.S. patent application Ser.

No. 09/832,880 filed on Apr. 12, 2001, entitled "Exchange-Based NMR Imaging and Spectroscopy of Hyperpolarized Xenon-129," and 3) pending and co-assigned International Patent Application Serial No. PCT/US02/11746 filed Apr. 12, 2002, entitled "Optimized High Speed Magnetic Resonance Imaging Method and System Using Hyperpolarized Noble Gases" (Publication Nos.: WO/02/084305 A2 & A3).

Some illustrative examples of magnetic resonance imaging using hyperpolarized gases are provided in the following patent applications and patents and are hereby incorporated by reference herein in their entirety: U.S. Pat. No. 5,545,396 to Albert et al., entitled "Magnetic Resonance Imaging Using Hyperpolarized Noble Gases;" U.S. Pat. No. 5,785,953 to Albert et al., entitled "Magnetic Resonance Imaging Using Hyperpolarized Noble Gases;" and U.S. Pat. No. 5,789,921 to Albert et al., entitled "Magnetic Resonance Imaging Using Hyperpolarized Noble Gases."

The MR system also includes an amplification and demodulation unit or system 10, which, after excitation of nuclear spins in a part of the body placed within the examination space by RF pulses, after encoding by the magnetic-field gradients and after reception of the resulting MR signals by the receiver coil, derives sampled phases and amplitudes from the received MR signals. An image reconstruction unit or system 12 processes the received MR imaging signals to, inter alia, reconstruct an image by methods well-known in the art, such as by Fourier transformation. It should be appreciated by one skilled in the art that various reconstruction methods may be employed besides the Fourier Transform (FT) depending on factors such as the type of signal being analyzed, the available processing capability, etc. For example, but not limited thereto, the present invention may employ Short-Time FT (STFT), Discrete Cosine Transforms (DCT), or wavelet transforms (WT). By means of an image processing unit or system 13, the reconstructed image is displayed, for example, on monitor 14. Further, the image reconstruction unit or system can optionally process MR navigator signals to determine the displacement of a portion of the patient.

The MR system also includes a control unit or system 11 that generates signals for controlling the RF transmitter and receiver systems by means of a modulator 6, the gradient magnetic field system by means of the power supply means 4, an image reconstruction unit or system 12 and an image processing unit or system 13. In a preferred embodiment, the control unit or system 11 (and other control elements in the MR system) are implemented with programmable elements, such as one or more programmable signal processors or microprocessors, communicating over busses with supporting RAM, ROM, EPROM, EEPROM, analog signal interfaces, control interfaces, interface to computer-readable media and so forth. These programmable elements are commanded by software or firmware modules loaded into RAM, EPROM, EEPROM or ROM, written according to well-known methods to perform the real-time processing required herein, and loaded from computer-readable media (or computer useable medium), such as magnetic disks or tapes, or optical disks, or network interconnections, removable storage drives, flash memory, or so forth. The present invention may be implemented using hardware, software or a combination thereof and may be implemented in one or more computer systems or processing systems, such as personal digit assistants (PDAs), for various applications, e.g., remote care and portable care practices.

In an embodiment, the control unit that directs a MR system for practicing the present invention can be implemented with dedicated electronic components in fixed circuit arrangements. In this case, these dedicated components are arranged to carry out the method described above. For example, the invention is implemented primarily in hardware using, for example, hardware components such as application specific integrated circuits (ASICs). Implementation of the hardware state machine to perform the functions described herein will be apparent to persons skilled in the relevant art(s).

In particular, the control unit commanded by its loaded software causes the generation of MR signals by controlling the application of MR pulse sequences, which comprise RF-pulses, time delays and temporary magnetic-field gradient pulses. These pulse sequences are generated according to the methods of the present invention as subsequently described, and generally include 2D and 3D imaging pulse sequences and optionally navigator pulse sequences for determining the displacement of the patient or material.

Furthermore, according to alternate embodiments of the present invention, the MR system also optionally includes various other units (not illustrated) from which the state of motion of the part of the patient being imaged can be measured. These can include sensors directly indicating the instantaneous state of motion of the part of the patient being imaged, such as a chest belt for directly indicating chest displacement during respiration, or MR-active micro-coils whose position can be tracked, or optical means, or ultrasound means, or so forth. These units can also include sensors indirectly indicating the instantaneous state of motion of the part of the patient being imaged. For example, electrocardiogram and peripheral pulse sensors measure the temporal progress of the cardiac cycle, and permit inference of the actual state of motion of the heart from knowledge of cardiac displacements associated with each phase of the cardiac cycle. When these sensors are present to measure the state of motion, the control unit need not generate navigator pulse sequences.

Moreover, the control unit or system 11 may also include a communications interface 24. The communications interface 24 allows software and data to be transferred between and among the control unit or system 11, reconstruction unit or system 12, image processing unit or system 13, and monitor 14 and external devices. Examples of the communications interface 24 may include a modem, a network interface (such as an Ethernet card), a communications port, a PCMCIA slot and card, etc. Software and data transferred via communications interface 24 are in the form of signals that may be electronic, electromagnetic, optical or other signals capable of being received by communications interface 24. The signals are provided to communications interface 24 via the communications path (i.e., channel) 26. The channel 26 carries signals and may be implemented using wire or cable, fiber optics, a phone line, a cellular phone link, a RF link, IR link, Bluetooth, and other communications channels.

Some embodiments of the present invention may be implemented as software/firmware/hardware with various MR systems, and methods, as one skilled in the art would appreciate. Other exemplary systems and methods, but not limited thereto, are disclosed in the following U.S. Patents, of which are hereby incorporated by reference in their entirety herein: U.S. Pat. No. 6,281,681 B1 to Cline et al., entitled "Magnetic Resonance Imaging with Interleaved Fibonacci Spiral," U.S. Pat. No. 6,230,039 B1 to Stuber et. al., entitled "Magnetic Resonance Imaging Method and System with Adaptively Selected Flip Angles," U.S. Pat. No. 5,749,834 to Hushek, entitled "Intersecting Multislice MRI Data Acquisition Method," U.S. Pat. No. 5,565,776 to Kanazawa, entitled "Magnetic Resonance Imaging Apparatus," U.S. Pat. No. 5,604,435 to Foo et al., entitled "Spiral Scanning Method for Monitoring Physiological Changes," and U.S. Pat. No. 5,485,086 to Meyer et al, entitled "Continuous Fluoroscopic MRI Using Spiral K-space Scanning."

The Methods of the Present Invention

The present invention applies to the creation of images of a suitable stationary or moving gas, or a gas-filled structure, using nuclear magnetic resonance (NMR) pulse sequence techniques. For our purpose, the term "suitable" means any gas that possesses nuclear magnetic properties that permit NMR signals to be derived from said gas. In particular, this invention applies to hyperpolarized gases (e.g., noble gases helium-3 and xenon-129, but not limited thereto), wherein we define the "hyperpolarized" state as a large (relative to the thermal equilibrium polarization for the polarizable gas in the applied static magnetic field), non-equilibrium nuclear polarization created by any method, including but not limited to optical pumping and spin exchange [16].

The present invention provides the framework for the design of a family of rapid MRI gas-imaging pulse sequences that maintain the phase coherence of at least a significant fraction of the transverse magnetization during the application of successive RF pulses and are specifically optimized to reduce the degree of signal attenuation resulting from the diffusion of said gas in the magnetic-field gradients required for imaging. In this manner, the present invention permits desirable combinations of spatial resolution, image SNR and temporal resolution to be achieved that were heretofore not possible using existing MRI pulse sequences. In the following, we will refer to pulse sequences that are designed according to the methods of the present invention as "diffusion-optimized".

Figure 1:
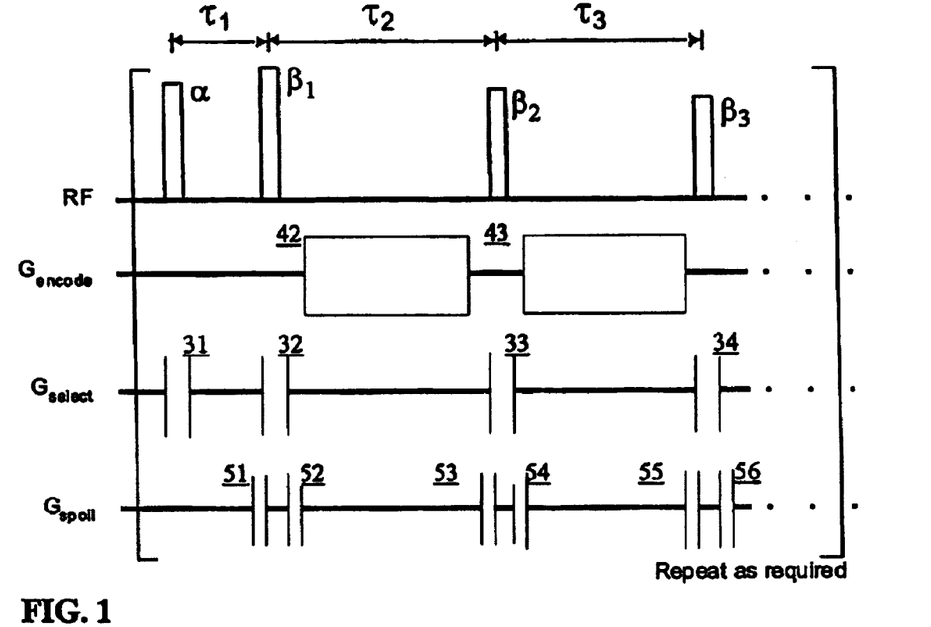
FIG. 1 shows a schematic representation of the general structure of an MRI pulse sequence that maintains the phase coherence of at least a significant fraction of the transverse magnetization during the application of successive RF pulses.

Turning now to FIG. 1, FIG. 1 shows a schematic representation of the general structure of an MRI pulse sequence that maintains the phase coherence of at least a significant fraction of the transverse magnetization during the application of successive RF pulses. This basic pulse-sequence structure provides the foundation for the diffusion-optimized pulse sequences that are subject of the present invention. For example, in the case of a RARE-type pulse sequence, α is the excitation RF pulse and is, typically equal to 90°, the pulses $\beta_1$, $\beta_2$ and $\beta_3$ are the first three of n refocusing RF pulses, $\tau_1$ typically equals one-half of $\tau_2$, and $\tau_i$ typically equals $\tau_{i+1}$ for i greater than one. As another example, in the case of a FISP-type pulse sequence using fully-rephased magnetic-field gradients over the repetition time, α is a preparation RF pulse and is typically equal to one half of $\beta_1$, the pulses $\beta_1$, $\beta_2$ and $\beta_3$ are the first three of n excitation RF pulses that are all typically of the same flip angle, $\tau_1$ typically equals one-half of $\tau_2$, and $\tau_i$ typically equals $\tau_{i+1}$ for i greater than one. The RF pulse waveforms are drawn as rectangular for simplicity, but they may be amplitude and/or phase modulated as appropriate for the desired application. The spacing between RF pulses may be fixed or may vary between pairs of pulses. The boxes on the $G_{encode}$ axis, referenced as 42 and 43, symbolically denote the magnetic-field gradient waveforms used for spatial encoding. The boxes on the $G_{select}$ axis, referenced as 31, 32, 33 and 34, symbolically denote the optional use of magnetic-field gradients for spatial and/or spatial-spectral selection. The boxes on the $G_{spoil}$ axis, referenced as 51, 52, 53, 54, 55 and 56, symbolically denote the optional use of magnetic-field gradients for spoiling of some subset of the phase-coherent transverse magnetization.

The series of RF pulses and the associated magnetic-field gradients can be repeated if necessary to collect the desired k-space data. The timing parameters and the number of echoes may vary between repetitions. For some applications the complete k-space data set is collected during a single application of the RF pulse train. Additional RF pulses, gradient pulses and/or time delays to permit additional control over the image contrast may optionally precede the RF pulse labeled α for at least one repetition of the RF pulse train.

Exemplary design methods to achieve a diffusion-optimized pulse sequence are enumerated below in design method items 1–6, each method of which is aimed at yielding a low level of diffusion-induced attenuation of the signals collected during the pulse sequence. Note that as explained in design methods 1–6 below, for a specific application, the use of specific methods may not be compatible with the particular form of pulse sequence (e.g., RARE-type or FISP-type) that is chosen as the foundation for the diffusion-optimized pulse sequence, or with particular desired features of the pulse sequence (e.g. a rectilinear k-space trajectory).

1. The spatial-encoding magnetic-field gradient waveforms are approximately fully rephased, i.e. have a zeroth moment approximately equal to zero (which includes fully rephased, i.e. have a zeroth moment equal to zero), over the time period between pairs of successive RF pulses.

2. Unless inappropriate as outlined in method 3, any spatial or spatial-spectral selection magnetic-field gradient waveforms associated with particular RF pulses are approximately fully rephased, i.e. have a zeroth moment approximately equal to zero.

3. For the case wherein a spin-echo-train pulse sequence, such as a RARE-type pulse sequence, serves as the foundation for the diffusion-optimized pulse sequence and wherein it is not desired to have approximately fully-rephased spatial or spatial-spectral selection magnetic-field gradient waveforms and/or it is desired to have spoiling magnetic-field gradients associated with the refocusing RF pulses, for example to avoid specific image artifacts, the flip angle for each of the refocusing RF pulses is approximately equal to 180°.

4. For the case that a specific type of k-space trajectory, for example a rectilinear or spiral trajectory, is not required, the k-space trajectory resulting from the spatial-encoding magnetic-field gradient waveforms is designed to traverse, at any time during the application of said gradients and including but not limited to the portions of the trajectory during which the associated NMR signal is sampled:

a. First, following the RF pulse $\beta_1$, a trajectory segment in k space wherein the maximum distance from zero spatial frequency is approximately zero.

b. Second, following the RF pulse $\beta_2$, a trajectory segment in k space wherein the maximum distance from zero spatial frequency is slightly larger than that for the trajectory segment corresponding to RF pulse $\beta_1$.

c. Third, following the RF pulse $\beta_3$, a trajectory segment in k space wherein the maximum distance from zero spatial frequency is slightly larger than that for the trajectory segment corresponding to RF pulse $\beta_2$, and so on for the remaining trajectory segments that are required to sample the desired region of k space.

The set of trajectory segments comprising the full k-space trajectory for the measurement is designed to meet the sampling requirements for the desired field-of-view in one, two or three dimensions, and the desired spatial resolution in each of said dimensions. An example of a k-space trajectory that fits this description for two-dimensional imaging is a set of concentric circles or semi-circles wherein the center approximately coincides with the center of k space and wherein the first trajectory has the smallest diameter, the second trajectory has the next smallest diameter, and so forth until the last trajectory has the largest diameter.

5. For the case of a k-space trajectory designed to meet the requirements of method 4, the order of collection of the trajectory segments can be rearranged so that the maximum distance from zero spatial frequency is not monotonically increasing as the RF pulse train progresses, but instead so that the majority of trajectory segments corresponding to small maximum distances from zero spatial frequency are acquired early in the RF pulse train, the majority of trajectory segments corresponding to medium maximum distances from zero spatial frequency are acquired approximately midway through the RF pulse train, and the majority of trajectory segments corresponding to large maximum distances from zero spatial frequency are acquired late in the RF pulse train. For example, considering the first, second and third trajectory segments described in method 4, the order 1, 3, 2, . . . , as compared to 1, 2, 3, . . . , would yield an acceptable result.

6. For the case wherein the RF pulse train $\alpha$, $\beta_1$, $\beta_2$, $\beta_3$, . . . is applied more than once to collect the desired k-space data and wherein a k-space trajectory that meets the requirements of methods 4 or 5 is used, the trajectory segments are interleaved across repetitions of the RF pulse train so that each RF pulse train begins by sampling relatively low spatial frequencies, followed by slightly higher spatial frequencies and so forth.

Further optimization of the diffusion-optimized pulse sequences may be warranted in some cases. Enumerated below, as design methods 7–10, are additional methods that can be optionally used to further reduce the diffusion-induced attenuation of the signals collected during the pulse sequence.

7. The spatial-encoding magnetic-field gradient waveforms are designed to exclude as much as possible any "dead" times in the waveforms, i.e., periods within the waveform during which the gradient amplitude is zero.

8. Considering the gradient performance specifications of the particular hardware being used, the diffusion-induced signal attenuation associated with the spatial-encoding, spatial selection, spatial-spectral selection and/or spoiling magnetic-field gradient waveforms is approximately minimized by selecting optimum values for the amplitude, slew rate, duration and functional form of each portion of said waveforms.

9. The data sampling period and the associated spatial-encoding gradient waveforms are considered jointly to approximately maximize the SNR while maintaining a predetermined level of image blurring, and/or a predetermined level of one or more other image artifacts such as a susceptibility-induced artifact, by balancing the signal increase that may occur secondary to reduced diffusion-induced signal attenuation from shorter spatial-encoding magnetic-field gradient waveform durations against the increase in noise secondary to shorter data sampling periods, and against the severity of other image artifacts that may increase with longer data sampling periods.

10. For k-space trajectories that use a conventional phase-encoding table as part of the spatial-encoding process, the order of phase-encoding steps is arranged so that the majority of phase-encoding steps corresponding to low spatial frequencies along the associated direction in k space are acquired early in the acquisition, the majority of phase-encoding steps corresponding to medium spatial frequencies are acquired approximately midway through the acquisition, and the majority of phase-encoding steps corresponding to high spatial frequencies are acquired late in the acquisition.

The aforementioned design methods may be performed in various orders and/or with modified procedures, systems, or structures suitable to a given application.

EXAMPLES

Practice of the invention will be still more fully understood from the following examples, which are presented herein for illustration only and should not be construed as limiting the invention in any way. The results from theoretical calculations and experimental measurements are presented below to provide examples of how the pulse-sequence design methods listed above serve to yield pulse sequences with reduced diffusion-induced signal attenuation compared to conventional pulse sequences currently employed for gas imaging. The theoretical results are from computer-based numerical simulations of the magnetization during a pulse sequence and are based on the well-established Bloch equation relationships and relevant extensions, and the relationship [17]:

$$b(t) = \int_0^t |k(t')|^2 \, dt' \qquad [1]$$

for the b value, which quantifies the degree of diffusion-induced signal attenuation corresponding to a specific path through k space, where k(t) is the time-dependent position in k space as determined by the applied gradients. The experimental results were acquired using a 1.5 Tesla commercial whole-body imager (Magnetom Vision, Siemens Medical Solutions, Iselin, N.J.) modified by the addition of a broadband RF amplifier to permit operation at the $^3$He resonant frequency of 48 MHz. Hyperpolarized-gas studies used a flexible $^3$He-chest RF coil (IGC Medical Advances, Milwaukee, Wis.). $^3$He experiments were performed under a physician's Investigational New Drug application (IND 57,866) for imaging with hyperpolarized $^3$He using a protocol approved by our institutional review board. $^3$He gas was polarized by collisional spin exchange with an optically pumped rubidium vapor using a commercial system (Model 9600 Helium Polarizer; Amersham Health, Durham, N.C.).

Figure 2:
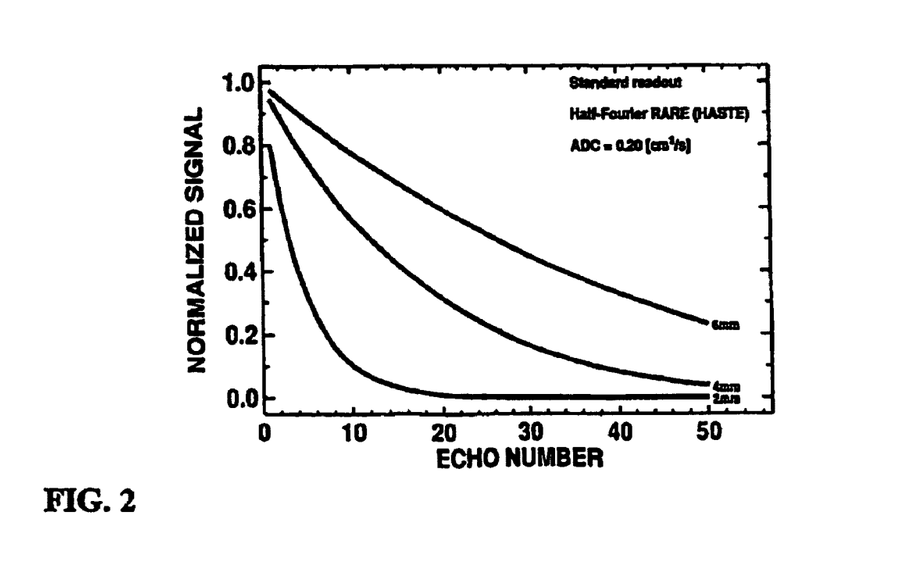
FIG. 2 shows theoretical calculations of the normalized signal versus echo number for a two dimensional half-Fourier RARE-type (HASTE) pulse sequence using a standard readout gradient waveform.

FIG. 2 shows the theoretically predicted effects of diffusion-induced signal attenuation in the healthy human lung for a half-Fourier RARE-type (HASTE) pulse sequence. Only the effects of in-plane spatial-encoding magnetic-field gradients are included. The apparent diffusion coefficient (ADC) of 0.2 cm$^2$/s corresponds to that for $^3$He in a healthy human lung. This pulse sequence used a standard readout gradient waveform, that is, a monopolar waveform having constant amplitude during the data-sampling period. As is well known, this configuration requires a preparatory readout gradient waveform, having an area equal to one half that of the readout gradient waveform, during the time period between the excitation RF pulse and the first refocusing RF pulse. This pulse sequence configuration is the same as that used in reference [13], wherein a minimum resolution of 6 mm was postulated for imaging $^3$He gas in the lung with a spin-echo-train pulse sequence based on an attenuation limit of 37% for the signal remaining at the end of the echo train. A 36-echo train was used in reference [13] and, as seen in FIG. 2, our calculations closely match their result. That is, at a resolution of 6 mm and echo number 36, the normalized signal in FIG. 2 is approximately 0.37.

Figure 3:
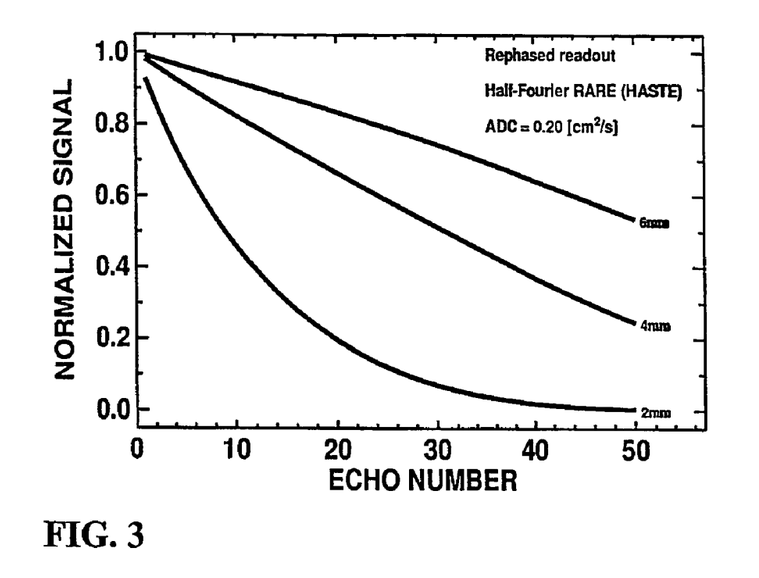
FIG. 3 shows theoretical calculations of the normalized signal versus echo number for a two dimensional half-Fourier RARE-type (HASTE) pulse sequence using a diffusion-optimized readout gradient waveform.

FIG. 3 shows the theoretically predicted effects of diffusion-induced signal attenuation in the healthy human lung for a half-Fourier RARE-type (HASTE) pulse sequence wherein, in contrast to FIG. 2, the readout gradient spatial-encoding waveform is optimized according to design methods 1, 7 and 8. (As in FIG. 2, only the effects of in-plane spatial-encoding magnetic-field gradients are included, and the ADC of 0.2 cm$^2$/s corresponds to that for $^3$He in a healthy human lung.) Note that, based on the 37% attenuation limit of reference [13], the spatial resolution limit for a 36-echo train has been reduced by one-third from 6 mm to 4 mm.

Figure 4:
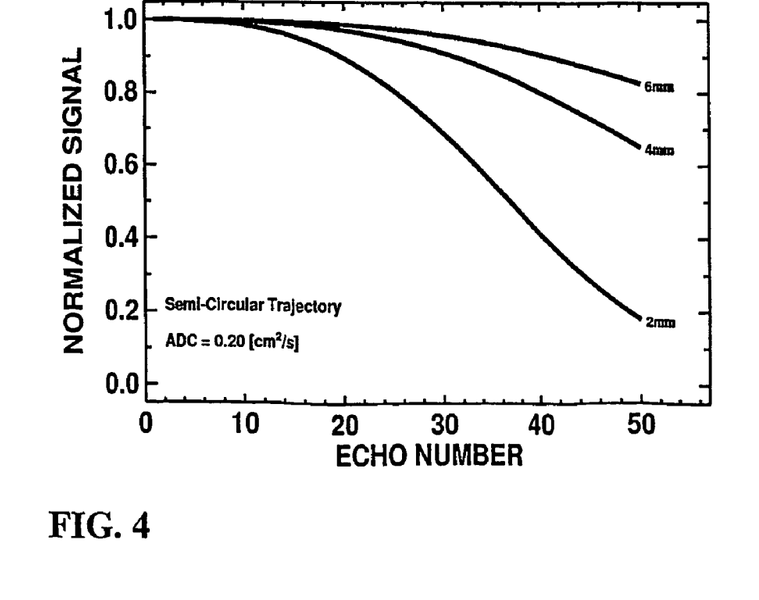
FIG. 4 shows theoretical calculations of the normalized signal versus echo number for a two dimensional half-Fourier spin-echo-train pulse sequence using a diffusion-optimized semi-circular k-space trajectory.

FIG. 4 shows the theoretically predicted effects of diffusion-induced signal attenuation in the healthy human lung for a half-Fourier spin-echo-train pulse sequence wherein, in contrast to FIGS. 2 and 3, the spatial-encoding magnetic-field gradient waveforms are optimized according to design methods 1, 4, 7 and 8, and, based on method 4, a semi-circular k-space trajectory is used. (As in FIGS. 2 and 3, only the effects of in-plane spatial-encoding magnetic-field gradients are included, and the ADC of 0.2 cm$^2$/s corresponds to that for $^3$He in a healthy human lung.) Note that, based on the 37% attenuation limit of reference [13], the spatial resolution limit for a 36-echo train has been reduced by more than two-thirds from 6 mm to less than 2 mm. Collectively, FIGS. 2–4 illustrate how the design methods of the present invention permit the diffusion-induced signal attenuation during the course of a spin-echo-train acquisition to be substantially reduced.

Figure 5A:
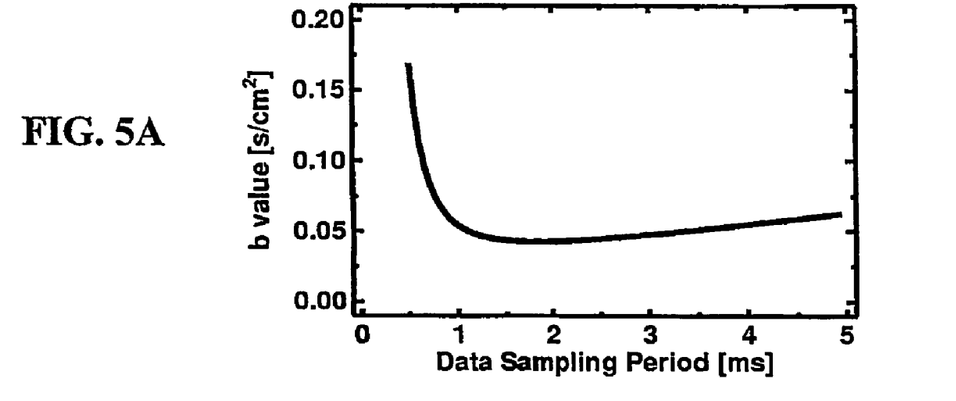
FIGS. 5(A)–(C) show theoretical calculations of the b value (FIG. 5(A)), waveform duration (FIG. 5(B)), and SNR characteristics of a fully-rephased (zeroth moment equal to zero) readout magnetic-field gradient waveform as a function of the data sampling period (FIG. 5(C)), for a spatial resolution of 4 mm; thereby illustrating that an optimum configuration of the waveform exists with respect to diffusion-induced signal attenuation and showing the signal-to-noise performance for this waveform when implemented in a True-FISP type pulse sequence.
Figure 5B:
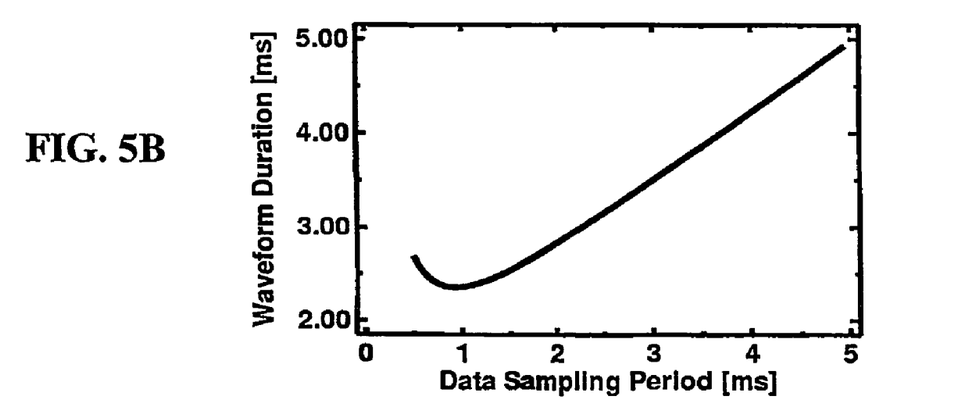

FIG. 5(A) demonstrates design method 8, the optimization of a magnetic-field gradient waveform based on the specifications for a particular gradient hardware system. In this example, the configuration of a fully-rephased readout gradient waveform that yields the minimum b value, and therefore the minimal diffusion-induced signal attenuation associated with this waveform, is derived for a spatial resolution of 4 mm and for a gradient system having a maximum gradient amplitude of 24 mT/m and a maximum gradient slew rate of 40 T/m/s. Naively, it may seem obvious that the minimum b value would coincide with the minimum duration of the readout gradient waveform. However, as shown by comparing FIGS. 5(A) and 5(B), this is not the case—the minimum b value occurs for a waveform duration that is larger than the minimum duration.

Figure 5C:
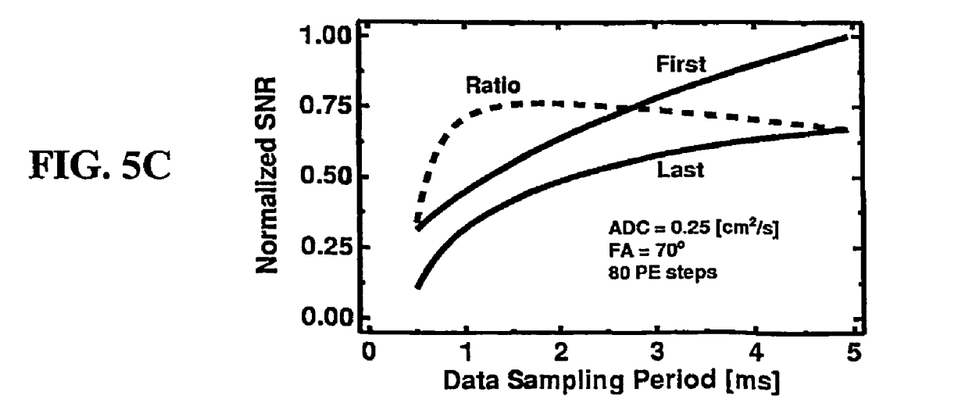

FIG. 5(C) presents data for implementing design method 9 for a FISP-type pulse sequence using fully-rephased gradient waveforms (i.e., a so-called "True-FISP" pulse sequence), 80 phase-encoding steps and a flip angle of 70° for the RF pulses $\beta_i$. FIG. 5(C) plots the SNRs for the first and last phase-encoding steps in the RF pulse train, and plots the ratio of these values. One would like to achieve a high value for the SNR of the first phase-encoding step, and for the ratio to maintain negligible image blurring secondary to signal attenuation during the RF pulse train. However, this type of pulse sequence is extremely susceptible to image artifacts from magnetic-field inhomogeneities; these artifacts can be reduced by decreasing the time period between successive RF pulses. In our case, this favors a reduction of the waveform duration. For application at a relatively high magnetic field strength, FIG. 5(C) suggests that the configuration corresponding to a data-sampling period of 1–1.5 ms would be a good choice.

Figure 6:
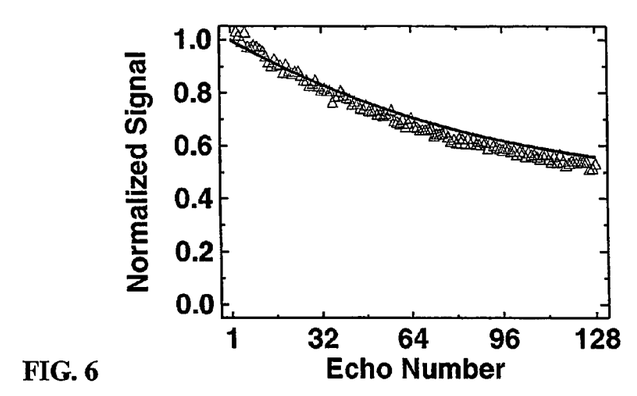
FIG. 6 show the theoretical (solid line) and experimental (triangles) signal decays during 128 repetitions of a True-FISP pulse sequence using the fully-rephased readout magnetic-field gradient waveform analyzed in FIG. 5 with a data-sampling period of 1.3 ms.

The validity of these theoretical calculations is supported by the experimental results presented in FIG. 6, for which the fully-rephased readout magnetic-field gradient waveform described in the previous two paragraphs was implemented with a data-sampling period of 1.3 ms in a True-FISP pulse sequence on a 1.5 Tesla whole-body imager (described above). Projection images were acquired of a torso-shaped phantom containing two high-pressure gas cells (Amersham Health, Durham N.C., USA). Each cell contained a mixture of O$_2$ and thermally polarized $^3$He and had the following characteristics: T1/T2, 1180/630 ms; diffusion coefficient, 0.26 cm$^2$/s. Pulse sequence parameters included: TR/TE, 6.14/3.07 ms; matrix, 128; field-of-view, 512 mm; flip angle, 70°; no phase encoding. FIG. 6 shows excellent agreement between the theoretically calculated signal decay (due both to T2 relaxation and diffusion-induced signal attenuation) and the experimentally measured signal intensities. Note that in this phantom roughly half of the signal loss is due to T2 decay. For in-vivo lung imaging, the T2 of $^3$He is estimated to be several seconds. Thus, for a typical healthy human lung, this gradient configuration should result in only 30% signal attenuation from diffusion for 128 RF pulses, making it viable for high SNR, high-quality imaging of the lung using hyperpolarized $^3$He.

For further experimental demonstration of the validity of our methods, the fully-rephased readout magnetic-field gradient waveform implemented in a True-FISP pulse sequence was used to obtain $^3$He lung images in four healthy human volunteers; the image quality and SNRs were compared to those for images obtained using a conventional gradient-echo pulse sequence, which is the current standard in the art for imaging the lung with hyperpolarized $^3$He gas. The $^3$He MRI studies in humans were performed as described above. Coronal lung images were acquired during suspended respiration using both True-FISP and gradient-echo pulse sequences. As discussed above, the readout gradient waveform in the True-FISP pulse sequence was optimized to provide a low b value (0.046 s/cm$^2$) for a maximum gradient slew rate of 40 T/m/s, a spatial resolution of 4 mm, and a data sampling period of 1.3 ms. Considering both the readout and slice-selection gradients, the theoretically-predicted signal attenuation for 80 phase-encoding steps and an apparent diffusion coefficient of 0.2 cm$^2$/s was 30%. Other parameters for the True-FISP pulse sequence included: TR/TE, 6.14/3.07 ms; matrix, 80*128; field-of-view, 320*512 mm; flip angle, 70°; slice thickness, 15 mm; phase-encoding order, sequential or centric. Parameters for the gradient-echo pulse sequence were: TR/TE, 7/2.7 ms; matrix, 80–112*128; field-of-view, 315–368*420–512 mm; flip angle, 9–10°; slice thickness, 10–15 mm. The SNR was calculated for the True-FISP and gradient-echo images, correcting for any differences in the voxel volume and the net hyperpolarized magnetization inhaled by the subject. Image artifacts were assessed by visual comparison.

Figure 7:
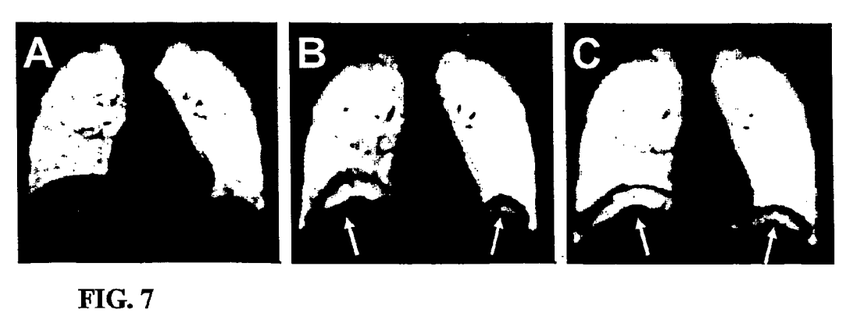
FIGS. 7(A)–(C) show coronal $^3$He lung MR images obtained from a healthy volunteer using gradient-echo (FIG. 7(A)), diffusion-optimized True-FISP with sequential phase encoding (FIG. 7(B)), and diffusion-optimized True-FISP with centric phase encoding (FIG. 7(C)).

The ratios of the mean SNRs for the True-FISP pulse sequences with sequential and centric phase-encoding to that for the gradient-echo pulse sequence were 3.0±0.2 and 3.4±0.6 respectively. As expected, due to signal decay from diffusion-induced attenuation, the SNR for the True-FISP pulse sequence with centric phase encoding was slightly higher than that for sequential phase encoding. FIG. 7 shows a comparison of gradient-echo and True-FISP images from the same subject, acquired with identical spatial resolution.

The overall depiction of the lung is similar with all techniques, but the True-FISP method shows artifactual intensity variations near the diaphragmatic border attributable to the high sensitivity of this technique to field inhomogeneities and to the fact that the experiments were performed at a relatively high magnetic field strength of 1.5 Tesla. The depiction of subtle detail was also slightly better in the gradient-echo images, although this can also be attributed to susceptibility variations in the vicinity of the pulmonary vessels and to the fact that the experiments were performed at a relatively high magnetic field strength of 1.5 Tesla.

One attractive feature of hyperpolarized-gas imaging is that, since the magnetization is created external to the main magnetic field using the laser-based polarization system, the SNR should be approximately independent of field strength as long as subject noise dominates coil noise. Therefore, application of these optimized True-FISP pulse sequences at field strengths of a few tenths of a Tesla should suppress the susceptibility-induced image artifacts while maintaining the SNR advantage.

The theoretical and experimental results presented above demonstrate that diffusion-optimized pulse sequences designed according to the methods of the present invention can provide image SNR several times higher than that which can be achieved using current methods.

In conclusion, an advantage of the present invention methodology, system, and computer program product is that it provides a means for designing and optimizing a rapid magnetic resonance imaging pulse sequence for creating images of a gas or gas-filled structure with substantially reduced diffusion-induced signal attenuation during the course of data acquisition compared to that for currently available magnetic resonance imaging techniques.

Another advantage of the present invention is that it provides a methodology and system that allows desirable combinations of image signal-to-noise ratio, spatial resolution and temporal resolution to be achieved that were heretofore not possible. For example, one application of the present invention is magnetic resonance imaging of hyperpolarized noble gases thereby achieving significant promise for several medical imaging applications, particularly imaging of the human lung.

Further, another advantage of the present invention is that it provides pulse sequences designed according to the subject methods to permit signal levels to be achieved that are up to ten times higher than those possible with the gradient-echo methods now commonly used for hyperpolarized-gas imaging. This signal increase can be traded for substantially lower dose, and hence much lower cost, of the hyperpolarized-gas agent.

In addition, another advantage of the present invention methodology and system is that it will also be useful for non-biological applications of hyperpolarized gases, for example material science studies, as well as for magnetic resonance imaging of any other gas for biological or non-biological applications.

Still yet, another advantage of the present invention is that it provides pulse sequences designed according to the subject methods that serve as the foundation for a variety of specialized gas-imaging pulse sequences, such as those for apparent-diffusion-coefficient, dynamic or oxygen-concentration imaging.

The present invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

REFERENCES

The following references as cited throughout this document are hereby incorporated by reference herein in their entirety:

1. Albert M S, Cates G D, Driehuys B, et al. Biological magnetic resonance imaging using laser-polarized $^{129}$Xe. Nature 1994; 370:199–201.
2. Middleton H, Black R D, Saam B, et al. MR imaging with hyperpolarized He-3 gas. Magn Reson Med 1995; 33:271–275.
3. Black R D, Middleton H L, Cates G D, et al. In vivo He-3 MR images of guinea pig lungs. Radiology 1996; 199: 867–870.
4. Kauczor H U, Hofmann D, Kreitner K F, et al. Normal and abnormal pulmonary ventilation: visualization at hyperpolarized He-3 MR imaging. Radiology 1996; 201:564–568.
5. MacFall J R, Charles H C, Black R D, et al. Human lung air spaces: potential for MR imaging with hyperpolarized He-3. Radiology 1996; 200:553–558.
6. Kauczor H U, Ebert M, Kreitner K F, et al. Imaging of the lungs using $^3$He MRI: preliminary clinical experience in 18 patients with and without lung disease. J Magn Reson Imaging 1997; 7:538–543.
7. de Lange E E, Mugler III J P, Brookeman J R, et al. Lung air spaces: MR imaging evaluation with hyperpolarized$^3$He gas. Radiology 1999; 210:851–857.
8. Altes T A, Powers P L, Knight-Scott J, et al. Hyperpolarized $^3$He MR lung ventilation imaging in asthmatics: preliminary findings. J Magn Reson Imaging 2001; 13:378–384.
9. Donnelly L F, MacFall J R, McAdams H P, et al. Cystic fibrosis: combined hyperpolarized $^3$He-enhanced and conventional proton MR imaging in the lung—preliminary observations. Radiology 1999; 212:885–889.
10. Hennig J, Nauerth A, Friedburg H. RARE imaging: A fast imaging method for clinical MR. Magn Reson Med 1986; 3:823–833.
11. Kiefer B, Grassner J, Hausmann R. Image acquisition in a second with half-Fourier-acquisition single-shot turbo spin echo. J Magn Reson Imaging 1994; 4(P):86.
12. Oppelt A, Graumann R, Barfuss H, Fischer H, Hartl W, SchajorW. FISP—a new fast MRI sequence. Electromedica 1986; 54:15–18.
13. Durand E, Guillot G, Darrasse L, et al. CPMG measurements and ultrafast imaging in human lungs with hyperpolarized helium-3 at low field (0.1 T). Magn Reson Med 2002; 47:75–81.
14. Salerno M, de Lange E E, Altes T A, Truwit J D, Brookeman J R, Mugler J P III. Emphysema: Hyperpolarized helium 3 diffusion MR imaging of the lungs compared with spirometric indexes—Initial experience. Radiology 2002; 222:252–260.
15. Salerno M, Altes T A, Brookeman J R, de Lange E E, Mugler J P III. Dynamic spiral MRI of pulmonary gas flow using hyperpolarized $^3$He: Preliminary studies in healthy and diseased lungs. Magn Reson Med 2001; 46:667–677.
16. Walker T G, Happer W. Spin-exchange optical pumping of noble gas nuclei. Rev Mod Phys 1997; 69:629–642.

17. Turner R, Le Bihan D, Maier J, Vavrek R, Hedges L K, Pekar J, Echo-planar Imaging of Intravoxel Incoherent Motion, Radiology, 1990, 177:407–414.

We claim:

1. A method for generating a pulse sequence for operating a magnetic resonance imaging system for imaging a region of an object, wherein at least a portion of the region contains gas for at least a portion of the time required to apply said pulse sequence, said method comprising the steps of:
   (a) selecting spatial-encoding magnetic-field gradient waveforms to be approximately fully rephased, that is to have a zeroth moment approximately equal to zero, over the time period between pairs of successive RF pulses in said pulse sequence;
   (b) if desired, selecting spatial and/or spatial-spectral selection magnetic-field gradient waveforms associated with RF pulses in said pulse sequence to be approximately fully rephased;
   (c) if it is not desired to have approximately fully-rephased spatial or spatial-spectral selection magnetic-field gradient waveforms of step 'b', and/or it is desired to have spoiling magnetic-field gradients associated with refocusing RF pulses, setting the flip angles for said refocusing RF pulses approximately equal to 180°;
   (d) if a specific type of k-space trajectory is not required, optimizing said k-space trajectory to provide a low level of diffusion-induced signal attenuation throughout the acquisition for either a single-shot or multi-shot acquisition; and
   (e) selecting said spatial-encoding magnetic-field gradient waveforms to exclude as much as possible any time in said spatial-encoding magnetic-field gradient waveforms during which the gradient amplitude is zero.

2. The method of claim 1, further comprising:
   selecting the magnetic-field gradient waveforms to approximately minimize diffusion-induced signal attenuation based on gradient-hardware specifications.

3. The method of claim 2, wherein the diffusion-induced signal attenuation associated with said spatial-encoding, said spatial selection, said spatial-spectral selection and/or said spoiling magnetic-field gradient waveforms is approximately minimized by selecting optimum values for the amplitude, slew rate, duration and functional form of each portion of said magnetic-field gradient waveforms.

4. The method of claim 1, further comprising:
   considering jointly said spatial-encoding gradient waveforms and associated data sampling period for approximately maximizing the SNR while maintaining a predetermined level of image blurring, and/or a predetermined level of one or more other image artifacts such as a susceptibility-induced artifact.

5. The method of claim 4, further comprising:
   balancing signal increase that may occur secondary to reduced diffusion-induced signal attenuation from shorter spatial-encoding magnetic-field gradient waveform durations against increase in noise secondary to shorter data sampling periods, and against severity of other image artifacts that may increase with longer data sampling periods.

6. The method of claim 1, further comprising:
   arranging the order of phase-encoding to increase said SNR during the acquisition compared to that for a conventional sequential phase-encoding order.

7. The method of claim 6, further comprising:
   ensuring that for said k-space trajectories that use a conventional phase-encoding table as part of the spatial-encoding process, the order of phase-encoding steps is arranged so that the majority of phase-encoding steps corresponding to low spatial frequencies along the associated direction in said k-space are acquired early in the acquisition, the majority of phase-encoding steps corresponding to medium spatial frequencies are acquired approximately midway through the acquisition, and the majority of phase-encoding steps corresponding to high spatial frequencies are acquired late in the acquisition.

8. The method of claim 1, wherein step 'c' is employed when a spin-echo-train pulse sequence serves as the foundation for said MRI pulse sequences.

9. The method of claim 1, wherein step 'd' further comprises:
   selecting a first trajectory segment in said k-space following the associated RF pulse such that the maximum distance from zero spatial frequency is approximately zero; and
   selecting subsequent trajectory segments needed to sample the desired region of said k-space that follow subsequent RF pulses such that the maximum distance from zero spatial frequency is increased incrementally for each additional trajectory segment.

10. The method of claim 9, wherein the order of collection of said trajectory segments can be rearranged so that the maximum distance from zero spatial frequency is not monotonically increasing as the RF pulse train progresses.

11. The method of claim 10, wherein the rearrangement provides that the majority of said trajectory segments corresponding to small maximum distances from zero spatial frequency are acquired early in said RF pulse train, the majority of said trajectory segments corresponding to medium maximum distances from zero spatial frequency are acquired approximately midway through said RF pulse train, and the majority of trajectory segments corresponding to large maximum distances from zero spatial frequency are acquired late in said RF pulse train.

12. The method of claim 9, wherein said RF pulse train is applied more than once to collect the desired k-space data and further comprises interleaving said trajectory segments across repetitions of said RF pulse trains so that each said RF pulse train begins by sampling relatively low spatial frequencies and then continues by sampling increasingly higher spatial frequencies.

13. The method of claim 1, wherein said gas is selected from at least one of hyperpolarized noble gases helium-3 and xenon-129.

14. A magnetic resonance imaging system for generating a pulse sequence for operating said magnetic resonance imaging system for imaging a region of an object, wherein at least a portion of the region contains gas for at least a portion of the time required to apply said pulse sequence, the system comprising:
   a main magnet system for generating a steady magnetic field in at least a region of the object to be imaged;
   a gradient magnet system for generating temporary magnetic field gradients in at least a region of the object to be imaged;
   a radio-frequency transmitter system for generating radio-frequency pulses in at least a region of the object to be imaged;
   a radio-frequency receiver system for receiving magnetic resonance signals from at least a region of the object to be imaged;
   a reconstruction system for reconstructing an image of the object from the received magnetic resonance signals; and a control system for generating signals controlling the gradient magnet system, the radio-frequency transmitter system, the radio-frequency receiver system, and the reconstruction system, wherein the control system generates signals causing:
(a) spatial-encoding magnetic-field gradient waveforms to be applied that are selected to be approximately fully rephased, that is to have a zeroth moment approximately equal to zero, over the time period between pairs of successive RF pulses in said pulse sequence;
(b) if desired, spatial and/or spatial-spectral selection magnetic-field gradient waveforms associated with RF pulses in said pulse sequence to be applied that are selected to be approximately fully rephased;
(c) if it is not desired to have approximately fully-rephased spatial or spatial-spectral selection magnetic-field gradient waveforms of step 'b', and/or it is desired to have spoiling magnetic-field gradients associated with refocusing RF pulses, flip angles for said refocusing RF pulses to be applied that are set to be approximately equal to 180°;
(d) if a specific type of k-space trajectory is not required, a k-space trajectory to be applied that is optimized to provide a low level of diffusion-induced signal attenuation throughout the acquisition for either a single-shot or multi-shot acquisition; and
(e) said spatial-encoding magnetic-field gradient waveforms to be applied that are selected to exclude as much as possible any time in said spatial-encoding magnetic-field gradient waveforms during which the gradient amplitude is zero.

15. A magnetic resonance imaging system for generating a pulse sequence for operating said magnetic resonance imaging system for imaging a region of an object, wherein at least a portion of the region contains gas for at least a portion of the time required to apply said pulse sequence, the system comprising:
a main magnet means for generating a steady magnetic field in at least a region of the object to be imaged;
a gradient magnet means for generating temporary magnetic field gradients in at least a region of the object to be imaged;
a radio-frequency transmitter means for generating radio-frequency pulses in at least a region of the object to be imaged;
a radio-frequency receiver means for receiving magnetic resonance signals from at least a region of the object to be imaged;
a reconstruction means for reconstructing an image of the object from the received magnetic resonance signals; and
a control means for generating signals controlling the gradient magnet means, the radio-frequency transmitter means, the radio-frequency receiver means, and the reconstruction means, wherein the control system generates signals causing:
(a) spatial-encoding magnetic-field gradient waveforms to be applied that are selected to be approximately fully rephased, that is to have a zeroth moment approximately equal to zero, over the time period between pairs of successive RF pulses in said pulse sequence;
(b) if desired, spatial and/or spatial-spectral selection magnetic-field gradient waveforms associated with RF pulses in said pulse sequence to be applied that are selected to be approximately fully rephased;
(c) if it is not desired to have approximately fully-rephased spatial or spatial-spectral selection magnetic-field gradient waveforms of step 'b', and/or it is desired to have spoiling magnetic-field gradients associated with refocusing RF pulses, flip angles for said refocusing RF pulses to be applied that are set to be approximately equal to 180°;
(d) if a specific type of k-space trajectory is not required, a k-space trajectory to be applied that is optimized to provide a low level of diffusion-induced signal attenuation throughout the acquisition for either a single-shot or multi-shot acquisition; and
(e) said spatial-encoding magnetic-field gradient waveforms to be applied that are selected to exclude as much as possible any time in said spatial-encoding magnetic-field gradient waveforms during which the gradient amplitude is zero.

* * * * *